United States Patent
Challier et al.

(10) Patent No.: US 6,199,031 B1
(45) Date of Patent: Mar. 6, 2001

(54) HDL SIMULATION INTERFACE FOR TESTING AND VERIFYING AN ASIC MODEL

(75) Inventors: Pierre Yves Challier, Cagnes sur Mer; Christelle Faucon, Plascassier; Jean Francois Duboc, St Laurent Du Var, all of (FR)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/144,680

(22) Filed: Aug. 31, 1998

(51) Int. Cl.[7] .................................................. G06F 17/50
(52) U.S. Cl. .............................. 703/14; 703/15; 703/16; 714/35; 716/4
(58) Field of Search ................................... 703/13, 14, 15, 703/16; 716/4, 5, 18; 714/35

(56) References Cited

U.S. PATENT DOCUMENTS

| | | | |
|---|---|---|---|
| 5,870,588 | * 2/1999 | Rompaey et al. | 703/13 |
| 6,016,555 | * 1/2000 | Deao et al. | 714/35 |
| 6,026,228 | * 2/2000 | Imai et al. | 716/18 |
| 6,094,730 | * 7/2000 | Lopez et al. | 714/28 |

OTHER PUBLICATIONS

Vranken et al., "Design–for–Debug in Hardware/Software Co–Design", Proceedings of the Fifth International Workshop on Hardware/Software Codesign, 1997, pp. 35–39, Mar. 1997.*

Lin et al., "Embedded Architecture Co–synthesis and System Intergration", Proc. Fourth Inter. Workshop on Hardware/Software Co–Design, 1996, pp. 2–9, Mar. 1996.*

Onufryk, P. Z. "Design and Verification of an Embedded Microprocessor", Proc. IEEE Inter. Conf. on Industrial Technology, 1996, pp. 786–790, Dec. 1996.*

Kucukcakar et al., "Matisse: An Architectural Design Tool for Commodity ICs", IEEE Design & Test of Computers, vol. 15, Issue 2, pp. 22–33, Jun. 1998.*

Zhongmin et al., "Rapid Prototyping for Simulation Debugging Environment: An Enhanced Developing Method for Embedded Computer Software", Inter. Conf. on Acoustics, Speech and Signla Processing, vol. 4, pp. 2663–2666, May 1995.*

Bolsens et al."Hardware/Software Co–Design of Digital Telecommunications Systems", Proceedings of the IEEE, vol. 85, No. 3, Mar. 1997, pp. 391–418.*

(List continued on next page.)

*Primary Examiner*—Kevin J. Teska
*Assistant Examiner*—Douglas W. Sergent
(74) *Attorney, Agent, or Firm*—Wagner, Murabito & Hao LLP

(57) ABSTRACT

An interface system for testing and verifying the design of an ASIC at different levels of abstraction, wherein the ASIC includes a logic entity and a processor entity. The system of the present invention is embodied as software which executes within a computer system. The software, when executed by the computer system, causes the computer system to implement a model of the ASIC, a simulator, and a test interface. The model of the ASIC is embodied in HDL (Hardware Description Language) and includes a logic entity and a processor entity. The simulator is adapted to test the model. The test interface interfaces the model with the simulator. The test interface includes a simulator portion and a model portion. The simulator portion is coupled to the simulator. The model portion is embodied in HDL and is coupled to both the logic entity and the processor entity. The model portion and the simulator portion are coupled to exchange information. The model portion is operable to obtain register status information of the processor entity and provide the register status information to the simulator via the simulator portion such that the register status is observable by the simulator as the model is simulated at different of levels of abstraction.

25 Claims, 9 Drawing Sheets

OTHER PUBLICATIONS

Petrot et al., "A Simulation Environment for Core Based Embedded Systems", Proc. 30th Annual Simulation Symposium, pp. 86–91, Apr. 1997.*

Vercauteren et al., "Constructing Application–Specific Heterogeneous Embedded Archtectures from Custom HW/SW Applications", Proc. 33rd ACM IEEE Design Automation Conf., pp. 521, Jun. 1996.*

Zorian et al., "System–Chip Test Strategies", Proc. 35th ACM IEEE Design Automation Conf. pp. 752–757, Jun. 1998.*

* cited by examiner

4 Oak Interface and Output

```
# ###############################################################
# ## OAKEMULATOR BASED VHDL MODEL                             ##
# ###############################################################
# ## Model Name   :    OAK  V2.0                              ##
# ###############################################################
# ###############################################################
# ## !!!  Type oak_help for Debug capabilities !!!            ##
# ###############################################################
# ##  Registers have been initialized to random values!!      ##
# ###############################################################

QHSIM 1> oak_help
# ###############################################################
# ## oak_help              Display this screen
# ## oak_break_on          Set breakpoints to stop the simulation
# ## oak_break_off         Disable breakpoints
# ## oak_break_list        Breakpoints list
# ## oak_cpu_state_on      Display the registers content after each instruction
# ## oak_cpu_state_off     Display the registers content is disabled
# ## oak_cpu_state_now     Display the registers content NOW
# ## oak_Xram_display      Display the content of X memory
# ## oak_Yram_display      Display the content of Y memory
# ## oak_mem_config        Size configuration for X and Y
# ## oak_access_on         Protection against x/y bad access on
# ## oak_access_off        Protection against x/y bad access off
# ## oak_open_trace        Open a register trace file
# ## oak_close_trace       Close a register trace file
# ## oak_step_on           Enable the step mode
# ## oak_step_off          Disable the step mode
# ###############################################################
```

FIG. 4

```
QHSIM 2> oak_cpu_state_on

# YOU SWITCH ON THE STATUS DISPLAY ######################
|------------------------- OAK INSTRUCTION STATUS -----------------------------------
|
|------------------------- OAK REGISTER STATUS --------------------------------------
| Calcul Unit Registers              | Data Address Unit Registers
|                                    |
| X = 0000   Y = 0000                | R0 = 0000 R4 = 0000
| P = 0000 0000                      | R1 = 0000 R5 = 0000
| A0 = 0 0000 0000                   | R2 = 0000
| A1 = 0 0000 0000                   | R3 = 0000
|                                    | CFGI = 0000 CFGJ = 0000
|                                    | CFGIB = 0000

|-------------------------------------------------------------------------------------
|
|        Control and Status Registers
|
| PC = 0000    LC = 0000
| ST0 = 0000   ST1 = 0000   ST2 = 0000
|
|-------------------------------------------------------------------------------------
|
| X = 0
|
| gexdbp = 0
| dxap = 0
| ppap = 0
| gip = 0

##################################################################
        - Trace File Definition:
        -------------------------
        - Do you really want a trace file (y/n) ? y
        - Please give the name of the trace file (6 chars max) with .trc : test.trc
        - Create file   test.trc

##################################################################
#       THIS FILE WILL BE VERY HUGE.  BE SURE YOU HAVE            #
#       ENOUGH  PLACE ON YOUR DISK!                               #
##################################################################
```

FIG. 5A

```
BREAKPOINT STATUS DISPLAY ##############################
Break on PC            ---> 1
Break on codop         ---> 2
Break on data address 1---> 3
Break on data value    ---> 4
Break on data address 2---> 5
end and validation     ---> 0
choose the way you want to put the breakpoint ?:1

BREAKPOINT ON PC ########################################
PC value to break on = 0000
choose the way you want to put the breakpoint ?: 0 all values change are OK (y/n)?y

BREAKPOINT STATUS DISPLAY ##############################

Request on PC =    0
```

Processed TIPO error :
---------------------------
```
BREAKPOINT STATUS DISPLAY ##############################
Break on PC            ---> 1
Break on codop         ---> 2
Break on data address 1---> 3
Break on data value    ---> 4
Break on data address 2---> 5
end and validation     ---> 0
choose the way you want to put the breakpoint ?: 6180
you are crazy!!!! control your fingers: choice is between 0,1,2,3,4,5
choose the way you want to put the breakpoint ?:
```

Display the status on breakpoint:
-----------------------------------------
```
BREAKPOINT STATUS DISPLAY ##############################

Request on PC =    0
Request on DATA ADDRESS1= F700
```

FIG. 5B display all the registers value when you want or in all the simulation:
--------------------------------------------------------------------------------

(# 84303 ns) PC:   3C :    0 : BRR  0X7F, true
| -------------------------- PINE INSTRUCTION STATUS --------------------------
| Instruction Fetch  = 2FF0 Clock Cycle Number =    195
| Instruction Decode  = 2FF0
|
| -------------------------- PINE REGISTER STATUS --------------------------

| Calcul Unit Registers         | Data Address Unit Registers    | Stack         |
|-------------------------------|--------------------------------|---------------|
| X = 0000  Y = CAFE            | R0 = 0000   R4 = CAFE          | TOS   = 0000  |
| P = CAFE CAFE                 | R1 = D7FF   R5 = CAFE          | STK1  = 0000  |
| A0 = F FFFF FFFF              | R2 = CAFE                      | STK2  = 0000  |
| A1 = 0 0000 0000              | R3 = 0015                      | SYK3  = 0000  |
|                               |                                | STK4  = 0000  |
|       CFGI = CAFE  CFGJ = CAFE                                 | STK5  = 0000  |
|         SI = 007E   SJ = 007E                                  | STK6  = 0000  |
|         MI = 0195   MJ = 0195                                  | STK7  = 0000  |

Control and Status Registers

| PC  = 003C     LC  = CAFE     LPG = 0000      | STK8  = 0000
| ST0 = F400     ST1 = 0000     ST2 = 0000      | STK9  = 0000
| Z   = 0000     IM1 = 0000     IU1 = 0000      | STK10 = 0000
| M   = 0001     IM0 = 0000     IU0 = 0000      | STK11 = 0000
|                                                 STK12 = 0000
| N   = 0000     SAT = 0000     OU1 = 0000      | STK13 = 0000
| V   = 0000     SP  = 0000     OU0 = 0000      | STK14 = 0000
| C   = 0000     IP1 = 0000     M5  = 0000      | STK15 = 0000
| E   = 0000     IP0 = 0001     M4  = 0000      | STK16 = 0000
| L   = 0000     STP = 0000     M3  = 0000
| R   = 0000     LP  = 0000     M2  = 0000
| IE  = 0000     M0  = 0000     M1  = 0000

(# 84703 ns) PC:   3D : 2FF0 : NOP

Display the X or Y RAM value:
--------------------------------

##########################################################
   - First address to dump in X space : 0
   - Last address to dump in X space : 200

FIG. 5C

X MEMORY DUMP ##########################################
Address            Values

```
         0x0000              0x0000
         0x0001              0x0000
         0x0002              0x0000

.....               .....

0x01fb              0x0000
         0x01fc              0x0000
         0x01fd              0x0000
         0x01fe              0x0000
         0x01ff              0x0000
         0x0200              0x0000
``` time | PCvalues| CODOP| Instruction
-----------------------------------------

```
(# 29703 ns ) PC:   2C : AAAA : MOV  ##0XAAAA. A0
(# 30103 ns ) PC:   2D : 5C01 : NOP
(# 30503 ns ) PC:   2E : D37F : MOV  ##0XD37F. R1
(# 30903 ns ) PC:   2F : 4B41 : MOV  A01, (R1)
(# 30903 ns ) Write OfCore (a/d): D37F : AAAA (# 31303 ns ) PC:   30 : 4CC1 : MOV  (R1), X
(# 31303 ns ) Read OfCore (a/d): D37F : 0000
(# 31703 ns ) PC:   31 : 8A06 : CMP  X, A0
(# 32103 ns ) PC:   32 : 2942 : NOP
(# 32503 ns ) PC:   46 :   0  : BRR  0X14, neq
(# 32903 ns ) PC:   47 : 482B : MOV  R1, (R3)+
(# 32903 ns ) Write Xram (a/d): 0014 : D37F
(# 33303 ns ) PC:   48 : 2EB0 : NOP
(# 33703 ns ) PC:   33 :   0  : BRR  0X6B, true
(# 34103 ns ) PC:   34 : 5C18 : NOP
(# 34503 ns ) PC:   35 : FFFF : MOV  ##0XFFFF, A0
(# 34903 ns ) PC:   36 : 5C01 : NOP
(# 35303 ns ) PC:   37 : D7FF : MOV  ##0XD7FF, R1
(# 35703 ns ) PC:   38 : 4B41 : MOV  A01, (R1)
(# 35703 ns ) Write OfCore (a/d): D7FF : FFFF
(# 36103 ns ) PC:   39 : 4CC1 : MOV  (R1), X
(# 36103 ns ) Read OfCore (a/d): D7FF : 0000
(# 36503 ns ) PC:   3A : 8A06 : CMP  X, A0
(# 36903 ns ) PC:   3B : 28D2 : NOP
(# 37303 ns ) PC:   48 :   0  : BRR  0X D, neq
(# 37703 ns ) PC:   49 : 4823 : MOV  R1, (R3)
(# 37703 ns ) Write Xram (a/d): 0015 : D7FF
```

FIG. 5D

HDL SIMULATION INTERFACE FOR TESTING AND VERIFYING AN ASIC MODEL

TECHNICAL FIELD

The present invention pertains to the field of integrated circuit development and simulation tools. More particularly, the present invention relates to a development system which provides a common user interface for the different phases of the development, simulation, and verification of a digital integrated circuit.

BACKGROUND ART

Digital integrated circuit systems, software applications, and the devices and processes built around them are continually growing in power and complexity. Society's reliance on such systems is likewise increasing, making it critical that the systems obey the properties their designers intended. Typically, the more powerful and complex the system, the greater its utility and usefulness. However, as these integrated circuit systems and the applications which use them become more powerful, detecting and correcting flaws within the systems becomes increasingly difficult.

Achieving the desired level of reliability in a complex system thus depends upon being able to analyze the system's design and characteristics early in the design process. In so doing, the consequences of design choices and trade-offs can be explored and tested prior to design implementation, and potentially disastrous flaws can be detected and remedied while their cost of repair is still relatively inexpensive. For example, detecting a flaw in a highly complex telecommunications integrated circuit prior to its mass fabrication is much more desirable and much more economical than correcting the consequences of the flaw after the circuit has been deployed in systems throughout the world. Electronics engineers and other designers of complex systems use numerous tools to aid in system design, simulation, and debugging.

Simulations play a vital part in the verification stages of integrated circuit development, especially in the case of customized application specific integrated circuits (ASICs), which are designed and brought to market rapidly. Simulation and verification tools are critical to the ASIC development cycle, and other such system development cycles. Hence, an ASIC design is not considered complete until it has been thoroughly simulated and its functionality completely verified.

ASICs are typically designed using some form of HDL (Hardware Description Language), such as VHDL, Verilog, or the like. The functionality and features of an ASIC design are typically embodied as a behavioral model, which describes the behavior of the ASIC. Verification at this stage is done by simulating the ASIC as defined by its behavioral model. The ASIC design is then synthesized using synthesis tools to specific target-libraries, which transform this "behavior" into a "netlist" represented by logic gates in that target-library. Verification at this stage is done by simulating the ASIC as defined by its netlist.

During the verification process, sophisticated simulation algorithms are used to verify the functional blocks of the ASIC. As used herein, each functional block in the design is referred to as an "entity." Verification after netlist synthesis is done by simulating the behavior of the individual gates that make up each entity. All of the entities are connected and interact to model the entire ASIC. The ASIC is typically modeled as a finite system having a finite number of possible states. Each state of the ASIC is represented as a state in a finite state machine. The designer, via the simulation tool, then examines this state machine to determine whether the complex system functions as desired. For example, the designer will examine the set of reachable states of the ASIC model and the transitions between the states to determine whether the ASIC can achieve all of its "desired states" and determine whether the ASIC successfully avoids all "illegal states." A desired state may represent, for example, correctly calculating a desired result. An illegal state may represent, for example, an error condition which results in a malfunction. The goal of the verification process is to determine the set of all reachable states from an initial state of an ASIC model and to use this information to verify the behavior of the ASIC design.

There is a problem, however, when an ASIC design includes one or more internal functional entities, and visibility/observability of that entity is critical to the verification process. One typical such case is where an ASIC design includes an internally embedded microprocessor core which implements many of the design's primary functions and features. The microprocessor implements complex functions of the ASIC. In order properly to verify the ASIC design, the operations of the microprocessor need to be observable. After design synthesis (e.g., into netlists), simulation typically yields only output wave forms for the ASIC design. Whereas a discreet microprocessor can be easily debugged and verified simply by observing the step-executed instructions, understanding, verifying, and debugging the embedded microprocessor ASIC design using only its output wave forms is virtually impossible.

This problem is greatly exacerbated by the geometrically increasing complexity of the latest ASICs. Many of these ASICs include multiple embedded microprocessors which implement very complex algorithms. Such ASICs can result in very complex output wave forms. With the advent of modern technology and growing needs for high-performance speed-intensive complex systems, the number of gates (or gate-count) in an ASIC is growing to a large number. 200,000 gates (approximately 1 million transistors) are quite common in typical ASICs. With 0.15 micron fabrication technology, 45 million gates per chip is predicted to be the order of the future generation of ASICs. For example a modern telecommunications ASIC often includes multiple DSP (digital signal processor) cores and a million or more gates, and processes information in data words of up to 64 bits in one cycle. This, in turn, makes it impossible completely to debug and verify the behavior of the ASIC without access and control of the embedded entities (e.g., DSP cores, microprocessor cores, etc.) of the ASIC simulation.

Thus, what is required is a system which provides for full and complete verification of an ASIC design. What is needed is a system which provides access to the inputs and outputs of embedded entities within a system ASIC. What is needed is a system which allows stepped execution of instructions for the embedded microprocessor or DSP entities of an ASIC during post synthesis simulation. What is further needed is a system which provides a single test interface to a system ASIC during the various abstraction levels of the design process (e.g., behavioral model simulation, netlist simulation, and simulation after place-and-route, etc.). The present invention provides a novel solution to the above requirements.

DISCLOSURE OF THE INVENTION

The present invention provides a system which enables the full and complete testing and verification of an ASIC design. The system of the present invention provides access to inputs and outputs of embedded entities within a system ASIC. The system of the present invention allows stepped execution of instructions for the embedded microprocessor or DSP entities of an ASIC during simulation at different abstraction levels, such as, for example, post synthesis simulation. The system of the present invention further provides a single test interface to a system ASIC during the various abstraction levels of the design process (e.g., behavioral model simulation, netlist simulation, and simulation after place-and-route, etc.).

In one embodiment, the system of the present invention comprises an interface system for testing and verifying the design of an ASIC at different levels of abstraction, wherein the ASIC includes a logic entity and a processor entity. The system of the present invention is embodied as software which executes within a computer system. The software, when executed by the computer system, causes the computer system to implement a model of the ASIC, a simulator, and a test interface. The model of the ASIC is embodied in HDL (Hardware Description Language) and includes a logic entity and a processor entity. The simulator is adapted to test the model. The test interface interfaces the model with the simulator. The test interface includes a simulator portion and a model portion. The simulator portion is coupled to the simulator. The model portion is embodied in HDL and is coupled to both the logic entity and the processor entity. The model portion and the simulator portion are coupled to exchange information.

The model portion is operable to obtain register status information of the processor entity and provide the register status information to the simulator via the simulator portion such that the register status is observable by the simulator as the model is simulated at different levels of abstraction. In so doing, the system of the present invention provides a single test interface to the model during the various abstraction levels of the design process (e.g., behavioral model simulation, netlist simulation, and simulation after place-and-route, etc.), thereby providing a system which enables the full and complete testing and verification of an ASIC design.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 4 shows an exemplary OAK DSP core user interface display in accordance with one embodiment of the present invention as appearing to a user.

FIG. 5A shows an exemplary OAK DSP core register status user interface display in accordance with one embodiment of the present invention.

FIG. 5B shows an exemplary OAK breakpoint status display in accordance with one embodiment of the present invention.

FIG. 5C shows an exemplary PINE DSP core user interface display in accordance with one embodiment of the present invention.

FIG. 5D shows an exemplary PINE DSP core address register contents display and a PINE DSP core debug display.

BEST MODE FOR CARRYING OUT THE INVENTION

Figure 1:
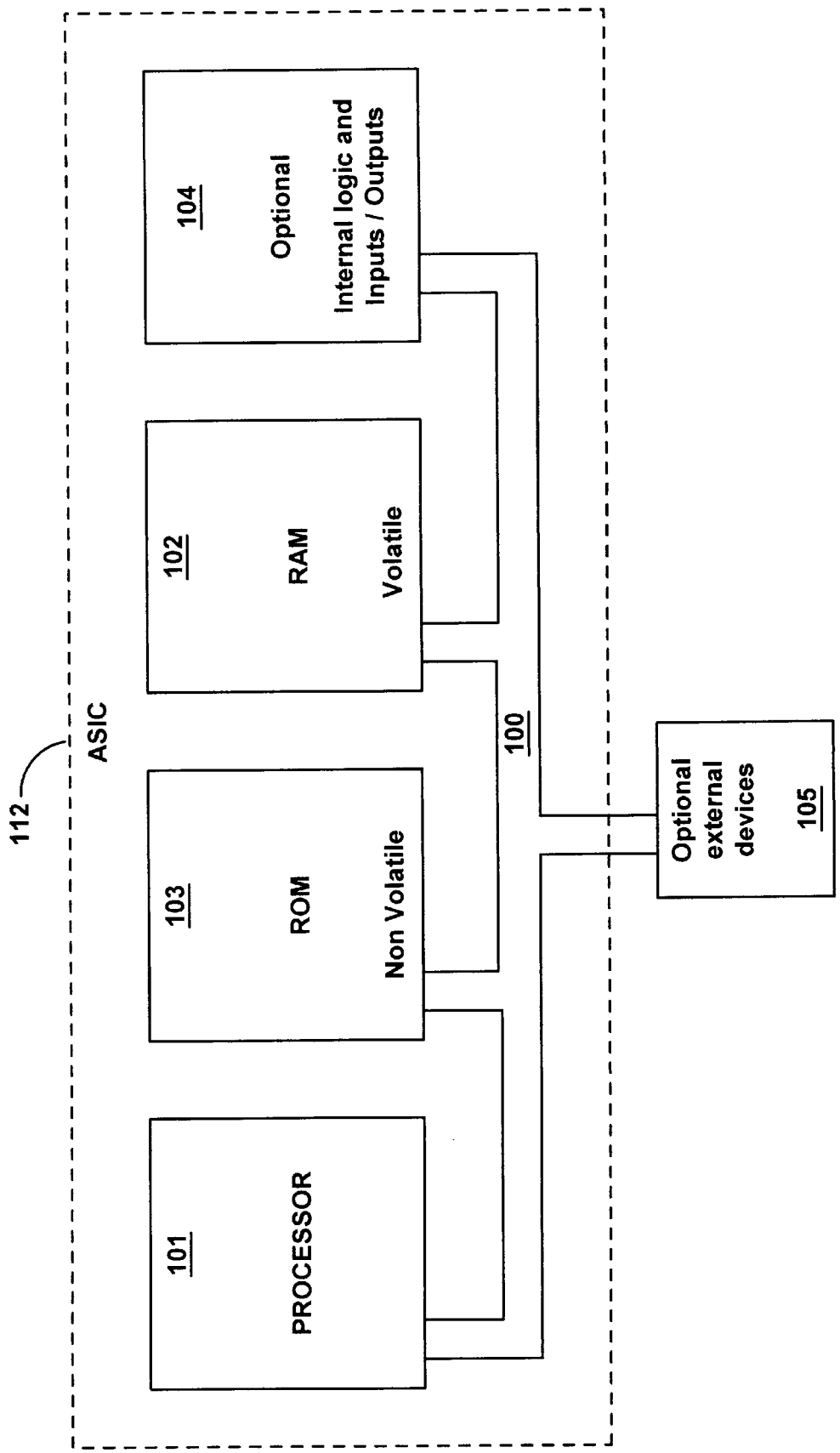
FIG. 1 shows an exemplary computer system which implements the system of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to the these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not unnecessarily to obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to convey most effectively the substance of their work to others skilled in the art. A procedure, logic block, process, step, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be born in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "implementing," "transferring," "executing," "arbitrating," "configuring," "bursting," "initializing," or the like, refer to the action and processes of a computer system (e.g., ASIC 112 of FIG. 1), or similar electronic computing device, that manipulates and transforms data represented as physical (electronic) quantities within the computer system's registers and memories into other data similarly represented as physical quantities within the computer system registers or memories, or other such information storage, transmission, or display devices.

The present invention provides a system which enables the full and complete testing and verification of an ASIC design. The system of the present invention provides access to inputs and outputs of embedded entities within a system ASIC. The system of the present invention allows stepped execution of instructions for the embedded microprocessor or DSP entities of an ASIC during simulation at different abstraction levels, such as, for example, post synthesis simulation. The system of the present invention further provides a single test interface to a system ASIC during the various abstraction levels of the design process (e.g., behavioral model simulation, netlist simulation, and simulation after place-and-route, etc.). The present invention and its benefits are further described below.

Refer to FIG. 1 which illustrates a typical ASIC. Within the following discussions of the present invention, certain processes and steps are discussed that are realized, in one embodiment, as a series of instructions (e.g., software program) that reside within computer readable memory units of ASIC 112 (e.g., built into the ASIC) and executed by processors of ASIC 112. When executed, the instructions cause the typical ASIC to perform specific actions and exhibit specific behavior which is described in detail below.

In general, ASIC 112 used by the present invention comprises an address/data bus 100 for communicating information, one or more central processors 101 coupled to the bus 100 for processing information and instructions, a computer readable volatile memory unit 102 (e.g., random access memory, static RAM, dynamic, RAM, etc.) coupled to the bus 100 for storing information and instructions for central processor(s) 101, a computer readable non-volatile memory unit 103 (e.g., read only memory, programmable ROM, flash memory, EPROM, EEPROM, etc.) coupled to bus 100 for storing static information and instructions for central processor(s) 101. Optional external devices 104 are coupled to ASIC 112 via bus 100.

Figure 2:
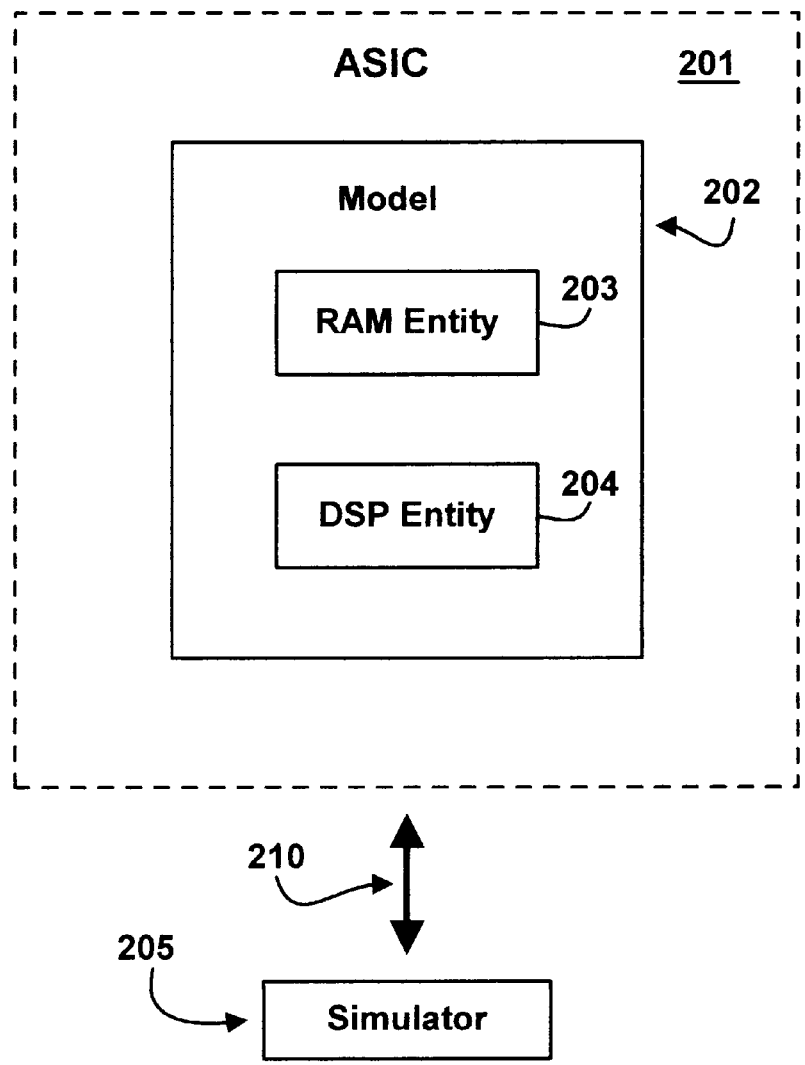
FIG. 2 shows a diagram of the software of a simulation system in accordance with one embodiment of the present invention.

With reference now to FIG. 2, a simulation system 200 in accordance with the present invention is shown. System 200, as shown in FIG. 2, depicts a software based model 201 which is instantiated within RAM 102 of ASIC 112. Model 201 models the functionality of an ASIC 202. The ASIC 202 includes a logic entity, RAM entity 203 and a processor entity, DSP entity 204. Model 201 runs "on top of" a simulator 205, which is itself also instantiated within RAM 102. The simulator 205 is communicatively coupled to model 201 to monitor the status, outputs, inputs, etc. of model 201 as its simulation is being run (e.g., on processor 101 of ASIC 112). This is shown by communications link 210.

As is well known in the art, model 201 is embodied as HDL code (e.g., VHDL, Verilog, etc.). In the present embodiment, model 201 is a VHDL based design. Model 201 is used to model the behavior, functionality, and features of ASIC 202. Model 201 runs on top of simulator 205. Simulator 205 applies test stimuli to model 201 at specified times and observes the responses of model 201 to the stimuli. These responses are often recorded and printed out for the ASIC designer as output wave forms. The responses, or test results, are interpreted by the designer to verify whether or not the design of ASIC 202 is satisfactory.

In most cases, ASIC 202 can be simulated at any stage of its design process. At higher levels of abstraction (e.g., the RTL, algorithmic, or system level) simulator 205 is capable of providing information regarding the functionality of ASIC 202 quickly and efficiently. Although fast, simulation at the higher levels does not provide the detailed information about the circuit functionality and timing of ASIC 202. To provide this information, simulator 205 runs model 201 at a lower level of abstraction (e.g., logic, circuit, or netlist level).

As is well known in the art, the high level abstraction (e.g., RTL description) of ASIC 202 is "synthesized," or translated, by an HDL compiler program to obtain a technology specific (e.g., CMOS) gate level or circuit level representation, often referred to as a "netlist." At this level, the actual performance characteristics of the target silicon (e.g., speed, timing, etc.) can be simulated using simulator 205 and the results scrutinized to validate the design of ASIC 202.

In the prior art, the interaction between internal entities of an ASIC model are not observable to simulator 205 at the low levels of abstraction (e.g., netlists). In accordance with the present invention, however, the signals passing between RAM entity 203 and DSP entity 204 are observable by simulator 205. In addition, the internal status of DSP entity 204 is also observable. This provides an important benefit to the ASIC designer.

Figure 3:
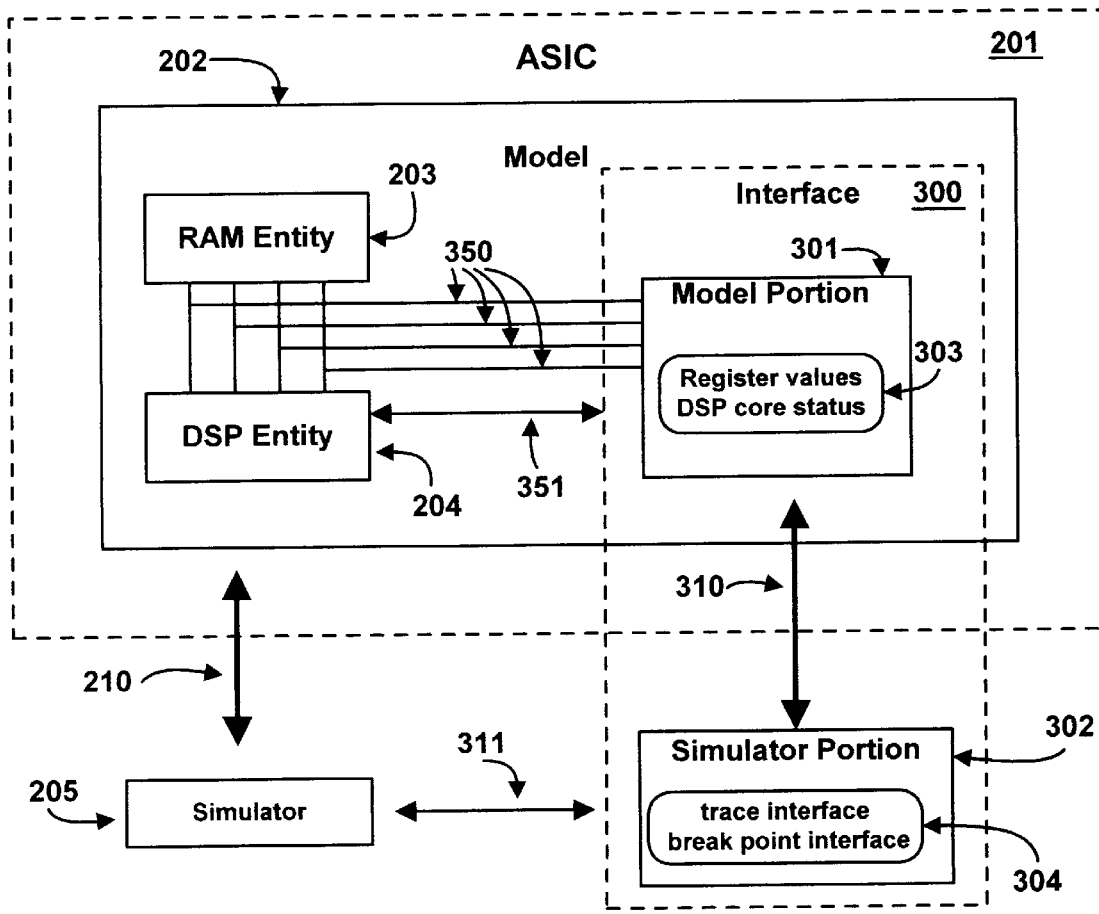
FIG. 3 shows a simulation system in accordance with one embodiment of the present invention in greater detail.

Referring now to FIG. 3, model 201 of the present invention is shown in greater detail. As depicted in FIG. 3, model 201 includes an interface 300 having a model portion 301 and a simulator portion 302. As with model 201 and simulator 205, interface 300 is instantiated as software within RAM 102 of ASIC 112. Interface 300 functions by providing access to the signals between RAM entity 203 and DSP entity 204 and access to the internal status of DSP entity 204.

The model portion of interface 300, as with ASIC model 202, is embodied in HDL. The model portion 301 of interface 300 is coupled to receive signals 350 exchanged between RAM entity 203 and DSP entity 204. Model portion 301 is also coupled to DSP entity 204 via communications link 351 to monitor the status 303 of DSP 204. Status 303 includes information, such as register values, DSP core status, and the like.

The simulator portion 302 is communicatively coupled to the model portion 301 via communications link 310. The simulator portion is also coupled to simulator 205 via communications link 311. The simulator portion functions by passing the DSP status 303 to simulator 205 which, in turn, provides this information to the ASIC designer. Simulator portion 302 also includes software which implements specialized control functions 304 to DSP entity 204. The control functions 304 include the capability for trace interface, break point interface, and the like. In the present embodiment, control functions 304 are implemented with DSP entity 204 via communications link 310, model portion 301, and communications link 351. As with simulator 205, simulator portion 302 is not embodied as HDL. This is depicted in FIG. 3 by simulator portion 302 being outside of the dotted line representing model 201.

In accordance with the present invention, interface 300 provides visibility to the signals occurring between RAM entity 203 and DSP entity 204 and provides visibility to the DSP status 303 of DSP entity 204. Since the model portion 301 of interface 300 is a parallel HDL block in ASIC 202, interface 300 is able to maintain this visibility across the different phases of the design process, across the different levels of abstraction. For example, as model 201 is synthesized from a high level VHDL RTL description into a series of low level netlists, model portion 301 is similarly synthesized, thereby maintaining communications links 350, 351, and 310. This preserves the ASIC designer's access to the inner workings of ASIC 202.

In addition, simulator portion 302 and model portion 301 provide the ASIC designer the capability of stepped execution and status for the DSP entity 204. The software of control functions 304 allow the ASIC designer to step execute the programming of DSP entity 204, thereby allowing the designer to view the contents/status of the register values and the status of DSP entity 204 as its program is executed one or more clock cycles at a time. In addition, control functions 304 allow the ASIC designer to set break points, wherein DSP entity 204 executes its programming and stops at predetermined break points, at which time the designer can examine the DSP register values and DSP core status.

For example, the inputs received by model portion 301 via communications links 350 and 351 include:

All the registers of the DSP core,
All the address busses of the DSP core, and
All the data busses of the DSP core.
The interface also includes an instruction disassembler.
The outputs of the simulator portion 302 of interface 300 include:

The status of the DSP core,
The content of all the registers of the DSP core,
The instructions in the pipeline of the DSP core,
The data transactions, and
Certain asynchronous events, such as interrupts.

An additional benefit of interface 300 is the fact that simulator portion 302 provides a common intuitive user interface for the ASIC designer throughout all phases of the design process. Since the same interface 300 is used at the different levels of abstraction, the designer can use the same user interface provided by simulator portion 302 as it executes alongside simulator 205. As described above, model portion 301 of interface 300 is a parallel block in model 201. Hence, interface 300 can be applied to model 201 from the first simulation of the behavioral model of ASIC 202 to the post-synthesis netlists, and to the netlists of ASIC 202 after place-and-route, allowing the ASIC designer to use the same user interface during all the design. The software structure of interface 300 is further described below.

Referring now to FIG. 4, an exemplary user interface display as appearing to an ASIC designer on display device 105 (of ASIC 112 from FIG. 1) is shown. FIG. 4 shows the display for an OAK™ DSP core model from DSP Group Inc. In FIGS. 5A through 5D below, additional user interface displays are shown and described.

FIG. 5A and FIG. 5B show exemplary user interface displays. For example, FIG. 5A is the display an ASIC designer uses for viewing OAK DSP core register status. FIG. 5B shows exemplary OAK breakpoint status displays.

FIG. 5C shows exemplary user interface displays for a PINE™ DSP core model from DSP Group Inc.

FIG. 5D shows exemplary user interface displays for the PINE DSP core address contents. FIG. 5D also shows a debug display used during stepped execution of the PINE DSP core.

Figure 6:
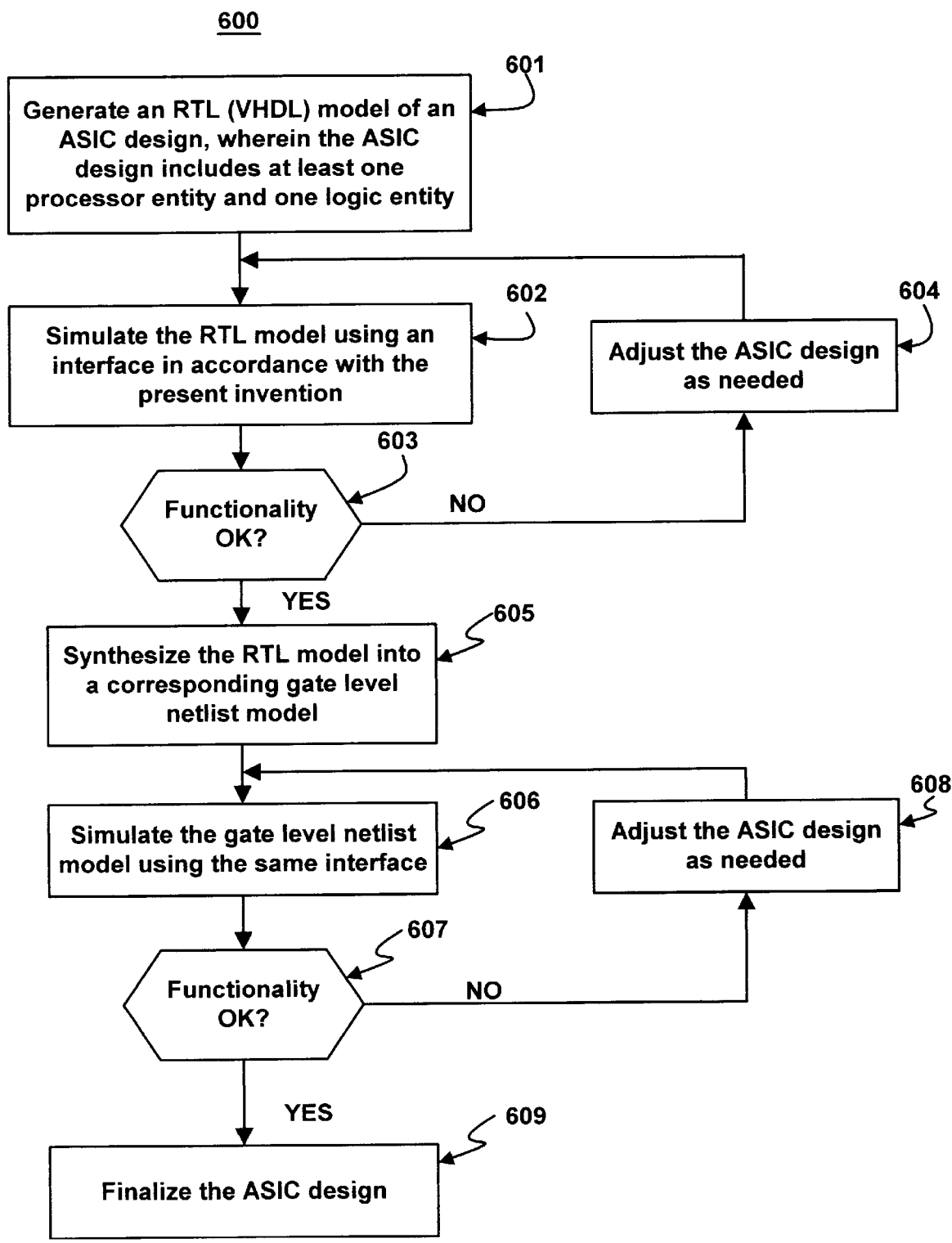
FIG. 6 shows a flow chart of an ASIC design process using a test interface in accordance with one embodiment of the present invention.

With reference now to FIG. 6, a flow chart of the steps of an HDL ASIC design simulation and synthesis process 600 in accordance with one embodiment of the present invention is shown. Process 600 shows the steps involved in a typical VHDL-based ASIC design simulation and verification process as performed using the interface of the present invention. Particularly, process 600 shows the steps of generating a high level model (RTL VHDL model), simulating the model using the interface of the present invention, synthesizing to a lower level model (gate level netlist) and simulating the model using the same interface.

In step 601, an RTL model (e.g., a VHDL-based RTL model) of an ASIC design is generated. As described above, the ASIC design includes at least one processor entity (e.g., a DSP core) and at least one logic entity (e.g., input-output logic). An interface (e.g., interface 300 from FIG. 3) is incorporated into the model to support testing and verification.

In step 602, the RTL model is simulated using interface 300. As described above, interface 300 includes a parallel model portion (e.g., model portion 301) and a simulator portion (e.g., simulator portion 302). Model portion 301 and simulator portion 302 provide observabililty regarding the register values, core status, etc., of the DSP core. The ASIC designer is able to observe the instructions as they execute (e.g., using stepped execution, breakpoints, etc.) to debug and verify the hardware and software of the ASIC design.

In step 603, the results of the simulation are checked to determine whether the functionality of the RTL model is satisfactory. If the RTL model simulation of the ASIC design checks out, process 300 proceeds to step 605. If the simulation indicates problems, process 600 proceeds to step 604, where the ASIC design is adjusted to correct the problems and the RTL model simulation is run again in step 602 to determine whether the adjustments were successful.

In step 605, where RTL model simulation checks out, the RTL model is synthesized into a corresponding gate level netlist model. As described above, the model portion of interface 300 is similarly synthesized.

In step 606, the gate level netlist model of the ASIC design is simulated using the same interface 300 as in step 602. As described above, model portion 301 and the simulator portion 302 of model 300 allow the ASIC designer to observe register values, core status, etc., of the DSP core as they execute.

In step 607, the results of the gate level netlist model simulation are checked to determine whether the functionality of the netlist model is satisfactory. If the simulation shows satisfactory results, process 300 proceeds to step 609 where the ASIC design is finalized through, for example, further gate level optimization, and the ASIC design is "signed off." If the simulation does not show satisfactory performance, process 600 proceeds to step 608, where the ASIC design is adjusted as needed, and to step 606 where the new gate level netlist model is again simulated using the interface of the present invention.

In this manner, the same interface 300 is used through both levels of abstraction, in this case, the RTL level and the netlist level. The ASIC designer maintains visibility of the internal status and register content of the processor entity (e.g., the DSP core) and is provided with a common interface for use throughout the various levels of abstraction of the ASIC design process.

Thus, the present invention provides a system which enables the full and complete testing and verification of an ASIC design. The system of the present invention provides access to inputs and outputs of embedded entities within a system ASIC. The system of the present invention allows stepped execution of instructions for the embedded microprocessor or DSP entities of an ASIC during simulation at different abstraction levels, such as, for example, post synthesis simulation. The system of the present invention further provides a single test interface to a system ASIC during the various abstraction levels of the design process (e.g., behavioral model simulation, netlist simulation, and simulation after place-and-route, etc.).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A system for testing and verifying an ASIC (application specific integrated circuit) design at different levels of abstraction, wherein the ASIC design includes a logic entity and a processor entity, the system comprising:

a computer system including a processor coupled to a memory via a bus, the computer system operable for executing software, where the software causes the computer system to implement:

a model of the ASIC design, the model embodied in HDL (hardware description language), the model including a logic entity and a processor entity;

a simulator adapted to test the model; and a test interface for interfacing the model with the simulator, the test interface comprising:

a simulator portion coupled to the simulator;

a model portion coupled to the logic entity and the processor entity, the model portion and the simulator portion coupled to exchange information, the model portion embodied in HDL; and the model portion operable to obtain a register status of the processor entity and provide the register status to the simulator via the simulator portion such that the register status is observable by the simulator as the model is simulated at different of levels of abstraction.

2. The system of claim 1, wherein the logic entity is input-output logic.

3. The system of claim 1, wherein the processor entity is a DSP (digital signal processor) core.

4. The system of claim 1, wherein the simulator is included within an ASIC development platform for simulating the ASIC design at different levels of abstraction to test the functionality of the ASIC design.

5. The system of claim 1, wherein the model is simulated at a first level of abstraction and a second level of abstraction using the test interface, the first level of abstraction being higher than the second level of abstraction.

6. The system of claim 5, wherein the first level of abstraction is an RTL (register transfer level) level of abstraction and the second level of abstraction is a gate-level netlist level of abstraction.

7. The system of claim 5, wherein the model portion is coupled to the logic entity and the processor entity, and wherein the model portion, the logic entity, and the processor entity are each embodied in HDL such that the model portion interfaces with the processor entity and the logic entity when the model portion, the logic entity and the processor entity are instantiated and simulated at both the first level of abstraction and when the model portion, the logic entity and the processor entity are instantiated and simulated at the second level of abstraction.

8. The system of claim 1, wherein the test interface is adapted to enable breakpoints in a test program running on the processor entity during simulation as the model is simulated at different of levels of abstraction.

9. The system of claim 1, wherein the test interface is adapted to enable observation of instructions in a pipeline of the processor entity during simulation as the model is simulated at different of levels of abstraction.

10. The system of claim 1, wherein the test interface enables observation of asynchronous events occurring in the processor entity during simulation as the model is simulated at different of levels of abstraction.

11. A system for testing and verifying an ASIC (application specific integrated circuit) design at different levels of abstraction, wherein the ASIC design includes a logic entity and a processor entity, the system comprising:

a computer system including a processor coupled to a memory via a bus, the computer system operable for executing software, where the software causes the computer system to implement:

a model of the ASIC design, the model embodied in HDL (hardware description language), the model including a logic entity and a processor entity;

a simulator adapted to test the model, wherein the simulator functions as an ASIC development platform for testing the functionality of the ASIC design; and a test interface for interfacing the model with the simulator, the test interface comprising:

a simulator portion coupled to the simulator;

a model portion coupled to the logic entity and the processor entity, the model portion and the simulator portion coupled to exchange information, the model portion embodied in HDL; and the model portion operable to obtain a register status of the processor entity and provide the register status to the simulator via the simulator portion such that the register status is observable by the simulator as the model is simulated at different of levels of abstraction, wherein the model is simulated at a first level of abstraction and a second level of abstraction using the test interface, the first level of abstraction being higher than the second level of abstraction.

12. The system of claim 11, wherein the logic entity is input-output logic.

13. The system of claim 11, wherein the processor entity is a DSP (digital signal processor) core.

14. The system of claim 11, wherein the first level of abstraction is an RTL (register transfer level) level of abstraction and the second level of abstraction is a gate-level netlist level of abstraction.

15. The system of claim 11, wherein the model portion is coupled to the logic entity and the processor entity, and wherein the model portion, the logic entity, and the processor entity are each embodied in HDL such that the model portion interfaces with the processor entity and the logic entity when the model portion, the logic entity and the processor entity are instantiated and simulated at both the first level of abstraction and when the model portion, the logic entity and the processor entity are instantiated and simulated at the second level of abstraction.

16. The system of claim 11, wherein the test interface is adapted to enable breakpoints in a test program running on the processor entity during simulation as the model is simulated at different of levels of abstraction.

17. The system of claim 11, wherein the test interface is adapted to enable observation of instructions in a pipeline of the processor entity during simulation as the model is simulated at different of levels of abstraction.

18. The system of claim 11, wherein the test interface enables observation of asynchronous events occurring in the processor entity during simulation as the model is simulated at different of levels of abstraction.

19. In a computer system including a processor coupled to a memory via a bus, computer implemented method for testing and verifying an ASIC (application specific integrated circuit) design at different levels of abstraction, wherein the ASIC design includes a logic entity and a processor entity, the computer system operable for executing software, where the software causes the computer system to implement the steps of:

a) modeling an ASIC design in HDL (hardware description language), the model including a logic entity and a processor entity;

b) simulating the ASIC design using a simulator adapted to test the model, wherein the simulator functions as an ASIC development platform for testing the functionality of the ASIC design;

c) simulating the model at a first level of abstraction and at a second level of abstraction, the first level of abstraction being higher than the second level of abstraction; and d) interfacing the model with the simulator using a test interface at the first level of abstraction and at the second level of abstraction, the test interface comprising:

a simulator portion coupled to the simulator; and a model portion coupled to the logic entity and the processor entity, the model portion and the simulator portion coupled to exchange information, the model portion embodied in HDL, the model portion operable to obtain a register status of the processor entity and provide the register status to the simulator via the simulator portion such that the register status is observable by the simulator as the model is simulated at different of levels of abstraction.

20. The method of claim 19, wherein the processor entity is a DSP (digital signal processor) core.

21. The method of claim 19, wherein the first level of abstraction is an RTL (register transfer level) level of abstraction and the second level of abstraction is a gate-level netlist level of abstraction.

22. The method of claim 19, wherein the model portion is coupled to the logic entity and the processor entity, and wherein the model portion, the logic entity, and the processor entity are each embodied in HDL such that the model portion interfaces with the processor entity and the logic entity when the model portion, the logic entity and the processor entity are instantiated and simulated at both the first level of abstraction and when the model portion, the logic entity and the processor entity are instantiated and simulated at the second level of abstraction.

23. The method of claim 19, wherein the test interface is adapted to enable breakpoints in a test program running on the processor entity during simulation as the model is simulated at different of levels of abstraction.

24. The method of claim 19, wherein the test interface is adapted to enable observation of instructions in a pipeline of the processor entity during simulation as the model is simulated at different of levels of abstraction.

25. The method of claim 19, wherein the test interface enables observation of asynchronous events occurring in the processor entity during simulation as the model is simulated at different of levels of abstraction.

\* \* \* \* \*